(12) United States Patent
Ichikawa et al.

(10) Patent No.: US 12,278,033 B2
(45) Date of Patent: Apr. 15, 2025

(54) MAGNETORESISTANCE EFFECT ELEMENT

(71) Applicant: TDK CORPORATION, Tokyo (JP)

(72) Inventors: Shinto Ichikawa, Tokyo (JP);
Katsuyuki Nakada, Tokyo (JP);
Kazuumi Inubushi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/981,112

(22) Filed: Nov. 4, 2022

(65) Prior Publication Data
US 2023/0144429 A1 May 11, 2023

(30) Foreign Application Priority Data

Nov. 8, 2021 (WO) .................. PCT/JP2021/041051

(51) Int. Cl.
*H01F 10/32* (2006.01)
*G01R 33/09* (2006.01)

(52) U.S. Cl.
CPC ......... *H01F 10/329* (2013.01); *G01R 33/093* (2013.01); *H01F 10/3213* (2013.01)

(58) Field of Classification Search
None
See application file for complete search history.

(56) References Cited

U.S. PATENT DOCUMENTS

| | | | |
|---|---|---|---|
| 6,876,522 B2 | 4/2005 | Ambrose et al. | |
| 7,336,453 B2 | 2/2008 | Hasegawa et al. | |
| 8,031,441 B2 | 10/2011 | Zhang et al. | |
| 8,064,244 B2 | 11/2011 | Zhang et al. | |
| 8,320,080 B1 | 11/2012 | Braganca et al. | |
| 9,087,980 B2 | 7/2015 | Daibou et al. | |
| 9,336,937 B2 | 5/2016 | Takahashi et al. | |
| 9,412,399 B2 | 8/2016 | Childress et al. | |
| 9,564,581 B1 | 2/2017 | Choi et al. | |

(Continued)

FOREIGN PATENT DOCUMENTS

| | | |
|---|---|---|
| CN | 109560192 A | 4/2019 |
| JP | 2005-085286 A | 3/2005 |

(Continued)

OTHER PUBLICATIONS

Choi et al., "Enhancement of current-perpendicular-to-plane giant magnetoresistance by insertion of amorphous ferromagnetic underlayer in Heusler alloy-based spin-valve structures," Applied Physics Express, 2017, vol. 10, pp. 013006-1-013006-4.

(Continued)

*Primary Examiner* — Kevin M Bernatz
(74) *Attorney, Agent, or Firm* — Oliff PLC

(57) ABSTRACT

A magnetoresistance effect element includes a first ferromagnetic layer, a second ferromagnetic layer, and a nonmagnetic layer. The nonmagnetic layer is between the first ferromagnetic layer and the second ferromagnetic layer. At least one of the first ferromagnetic layer and the second ferromagnetic layer is a Heusler alloy layer. The nonmagnetic layer includes a first region and a second region in a plane. Both of the first region and the second region are formed of a metal. The second region is different in constituent material from the first region. The second region has a crystal structure of a body-centered cubic lattice structure (bcc).

13 Claims, 9 Drawing Sheets

(56) References Cited

U.S. PATENT DOCUMENTS

| | | | |
|---|---|---|---|
| 9,643,385 B1 | 5/2017 | Butler et al. | |
| 9,899,044 B2 | 2/2018 | Furubayashi et al. | |
| 10,020,445 B2 | 7/2018 | Inubushi et al. | |
| 10,388,347 B2 | 8/2019 | Matsumoto et al. | |
| 10,453,482 B2 | 10/2019 | Inubushi et al. | |
| 10,505,105 B2 | 12/2019 | Inubushi et al. | |
| 10,559,749 B2 | 2/2020 | Inubushi et al. | |
| 10,755,733 B1 | 8/2020 | Zheng et al. | |
| 10,777,247 B1 | 9/2020 | Sun | |
| 10,804,671 B1 | 10/2020 | Kirchner et al. | |
| 10,937,451 B2 | 3/2021 | Inubushi et al. | |
| 10,937,954 B2 | 3/2021 | Inubushi et al. | |
| 11,004,465 B2 | 5/2021 | Kasai et al. | |
| 11,107,908 B2 | 8/2021 | Manipatruni et al. | |
| 11,170,803 B1 | 11/2021 | Liu et al. | |
| 11,309,115 B2 | 4/2022 | Nakada | |
| 11,335,365 B2 | 5/2022 | Inubushi et al. | |
| 11,362,269 B2 | 6/2022 | Cai et al. | |
| 11,410,689 B2 | 8/2022 | Inubushi et al. | |
| 11,525,873 B2 * | 12/2022 | Ichikawa | H10N 50/80 |
| 11,581,365 B2 | 2/2023 | Nakada et al. | |
| 11,694,714 B2 | 7/2023 | Inubushi et al. | |
| 11,730,063 B2 | 8/2023 | Inubushi et al. | |
| 11,769,523 B2 | 9/2023 | Inubushi et al. | |
| 11,967,348 B2 | 4/2024 | Nakada et al. | |
| 12,040,115 B1 | 7/2024 | Inubushi et al. | |
| 2002/0000575 A1 | 1/2002 | Sato et al. | |
| 2002/0159203 A1 | 10/2002 | Saito et al. | |
| 2003/0168673 A1 | 9/2003 | Yuasa et al. | |
| 2006/0114619 A1 * | 6/2006 | Sbiaa | B82Y 10/00 |
| | | | 360/324.12 |
| 2006/0183002 A1 | 8/2006 | Yang et al. | |
| 2006/0215330 A1 | 9/2006 | Ide et al. | |
| 2006/0262460 A1 | 11/2006 | Ide et al. | |
| 2007/0217087 A1 | 9/2007 | Hirata et al. | |
| 2007/0230070 A1 | 10/2007 | Mizuno et al. | |
| 2008/0100969 A1 | 5/2008 | Mizuno et al. | |
| 2008/0268290 A1 | 10/2008 | Carey et al. | |
| 2008/0278864 A1 | 11/2008 | Zhang et al. | |
| 2009/0141410 A1 | 6/2009 | Jogo et al. | |
| 2009/0168266 A1 * | 7/2009 | Sato | B82Y 25/00 |
| | | | 360/324.1 |
| 2009/0168269 A1 | 7/2009 | Carey et al. | |
| 2009/0268353 A1 | 10/2009 | Carey et al. | |
| 2010/0072529 A1 | 3/2010 | Marukame et al. | |
| 2010/0103565 A1 | 4/2010 | Lou | |
| 2010/0149863 A1 | 6/2010 | Lee et al. | |
| 2010/0157465 A1 | 6/2010 | Sakamoto et al. | |
| 2011/0043950 A1 | 2/2011 | Carey et al. | |
| 2011/0089940 A1 | 4/2011 | Carey et al. | |
| 2011/0129691 A1 | 6/2011 | Ishiwata et al. | |
| 2011/0207240 A1 | 8/2011 | Lim et al. | |
| 2012/0009337 A1 | 1/2012 | Zhang et al. | |
| 2012/0241881 A1 | 9/2012 | Daibou et al. | |
| 2013/0014798 A1 | 1/2013 | Nishide et al. | |
| 2013/0236639 A1 | 9/2013 | Carey et al. | |
| 2013/0242435 A1 | 9/2013 | Fuji et al. | |
| 2013/0302649 A1 | 11/2013 | Takahashi et al. | |
| 2013/0313506 A1 | 11/2013 | Murayama et al. | |
| 2014/0063648 A1 | 3/2014 | Shiroishi et al. | |
| 2015/0010780 A1 | 1/2015 | Carey et al. | |
| 2015/0078070 A1 | 3/2015 | Quinsat et al. | |
| 2015/0116867 A1 | 4/2015 | Childress et al. | |
| 2015/0311305 A1 | 10/2015 | Ishikawa et al. | |
| 2016/0019917 A1 | 1/2016 | Du et al. | |
| 2016/0380185 A1 | 12/2016 | Kato et al. | |
| 2017/0077394 A1 | 3/2017 | Saida | |
| 2017/0092307 A1 | 3/2017 | Du et al. | |
| 2017/0221507 A1 * | 8/2017 | Furubayashi | G11B 5/1278 |
| 2017/0221577 A1 | 8/2017 | Choe | |
| 2017/0229643 A1 | 8/2017 | Chen et al. | |
| 2018/0226573 A1 | 8/2018 | Chen et al. | |
| 2018/0243691 A1 | 8/2018 | Mueller et al. | |
| 2018/0254409 A1 | 9/2018 | Nakada et al. | |
| 2018/0301611 A1 | 10/2018 | Fukatani et al. | |
| 2018/0301621 A1 | 10/2018 | Sato et al. | |
| 2018/0342668 A1 | 11/2018 | Inubushi et al. | |
| 2019/0019942 A1 | 1/2019 | Nakada et al. | |
| 2019/0074430 A1 | 3/2019 | Shiokawa et al. | |
| 2019/0088395 A1 | 3/2019 | Ota et al. | |
| 2019/0094315 A1 * | 3/2019 | Inubushi | G11B 5/3909 |
| 2019/0109277 A1 | 4/2019 | Jan et al. | |
| 2019/0164587 A1 | 5/2019 | Machida et al. | |
| 2019/0189172 A1 | 6/2019 | Higo et al. | |
| 2019/0355898 A1 | 11/2019 | Nakada | |
| 2020/0051724 A1 | 2/2020 | Doyle et al. | |
| 2020/0158796 A1 | 5/2020 | Ikhtiar et al. | |
| 2020/0266336 A1 | 8/2020 | Nakada et al. | |
| 2020/0321393 A1 | 10/2020 | Manipatruni et al. | |
| 2020/0403149 A1 | 12/2020 | Guisan et al. | |
| 2021/0043225 A1 | 2/2021 | Inubushi et al. | |
| 2021/0043226 A1 | 2/2021 | Inubushi et al. | |
| 2021/0043682 A1 | 2/2021 | Nakada et al. | |
| 2021/0265562 A1 * | 8/2021 | Ichikawa | H01F 10/26 |
| 2021/0286028 A1 | 9/2021 | Ichikawa et al. | |
| 2022/0130901 A1 | 4/2022 | Sonobe et al. | |
| 2023/0144429 A1 | 5/2023 | Ichikawa et al. | |
| 2023/0210016 A1 | 6/2023 | Ichikawa et al. | |
| 2023/0292625 A1 | 9/2023 | Nakada et al. | |
| 2023/0337549 A1 | 10/2023 | Inubushi et al. | |
| 2024/0112695 A1 | 4/2024 | Ichikawa et al. | |
| 2024/0266099 A1 * | 8/2024 | Inubushi | H01F 10/1936 |
| 2024/0339255 A1 * | 10/2024 | Inubushi | H01F 10/3268 |

FOREIGN PATENT DOCUMENTS

| | | | | |
|---|---|---|---|---|
| JP | 2007-250977 A | 9/2007 | | |
| JP | 2007-273657 A | 10/2007 | | |
| JP | 2007-324269 A | 12/2007 | | |
| JP | 2008-112841 A | 5/2008 | | |
| JP | 2010-141340 A | 6/2010 | | |
| JP | 2010-146650 A | 7/2010 | | |
| JP | 2012-190914 A | 10/2012 | | |
| JP | 2013-247198 A | 12/2013 | | |
| JP | 2014-049145 A | 3/2014 | | |
| JP | 5441005 B2 | 3/2014 | | |
| JP | 2015-060609 A | 3/2015 | | |
| JP | 6137577 B2 | 5/2017 | | |
| JP | 2017-097935 A | 6/2017 | | |
| JP | 2017-103419 A | 6/2017 | | |
| JP | 6204769 B2 | 9/2017 | | |
| JP | 2019-021751 A | 2/2019 | | |
| JP | 2019-046976 A | 3/2019 | | |
| JP | 2019-047120 A | 3/2019 | | |
| JP | 2019-062060 A | 4/2019 | | |
| JP | 2019-201095 A | 11/2019 | | |
| JP | 2021125551 A * | 8/2021 | | G01R 33/0052 |
| WO | WO-2016017612 A1 * | 2/2016 | | G11B 5/1278 |
| WO | 2017/208653 A1 | 12/2017 | | |

OTHER PUBLICATIONS

Goripati et al., "Bi-quadratic interlayer exchange coupling in Co2MnSi/Ag/Co2MnSi pseudo spin-valve," Journal of Applied Physics, 2011, vol. 110, pp. 123914-1-123914-7.

Furubayashi et al., "Structure and transport properties of current-perpendicular-to-plane spin valves using Co2FeAl0.5Si0.5 and Co2MnSi Heusler alloy electrodes," Journal of Applied Physics, 2010, vol. 107, pp. 113917-1-113917-7.

Iwase et al., "Large Interface Spin-Assymetry and Magnetoresistance in Fully Epitaxial Co2MnSi/Ag/Co2MnSi Current-Perpendicular-to-Plane Magnetoresistive Devices," Applied Physics Express, 2009, vol. 2, pp. 063003-1-063003-3.

Jung et al., "Enhancement of magnetoresistance by inserting thin NiAl layers at the interfaces in Co2FeGa0.5Ge0.5/Ag/Co2FeGa0.5Ge0.5 current-perpendicular-to-plane pseudo spin valves," Applied Physics Letters, 2016, vol. 108, pp. 102408-1-102408-5.

Aug. 25, 2021 Office Action issued in U.S. Appl. No. 16/777,036.

Jan. 13, 2022 Notice of Allowance issued in U.S. Appl. No. 16/777,036.

U.S. Appl. No. 16/817,690, filed Mar. 13, 2020 in the name of Inubushi et al.

(56) References Cited

OTHER PUBLICATIONS

Aug. 4, 2020 Office Action issued in U.S. Appl. No. 16/817,690.
Nov. 16, 2020 Notice of Allowance issued in U.S. Appl. No. 16/817,690.
Jan. 13, 2022 Notice of Allowance issued in U.S. Appl. No. 16/984,389.
Aug. 4, 2022 Office Action issued in U.S. Patent Application No. 16/986, 431.
U.S. Appl. No. 16/986,431, filed Aug. 6, 2020 in the name of Nakada et al.
U.S. Appl. No. 17/115,283, filed Dec. 8, 2020 in the name of Inubushi et al.
U.S. Appl. No. 17/714,237, filed Apr. 6, 2022 in the name of Inubushi et al.
U.S. Appl. No. 18/019,919, filed Feb. 6, 2023 in the name of Nakada et al.
Nov. 9, 2022 Notice of Allowance issued in U.S. Appl. No. 16/986,431.
Feb. 7, 2023 Notice of Allowance issued in U.S. Appl. No. 17/714,237.
Nov. 9, 2023 Office Action issued in U.S. Appl. No. 18/019,919.
Feb. 7, 2024 Notice of Allowance issued in U.S. Appl. No. 18/019,919.
U.S. Appl. No. 18/240,657, filed Aug. 31, 2023 in the name of Inubushi et al.
Sep. 20, 2024 Notice of Allowance received in U.S. Appl. No. 18/240,657.
Nov. 30, 2022 Office Action issued in U.S. Appl. No. 17/115,283.
Masayuki Takahishi et al. "Magnetoresistance Ratio and Resistance Area Design of CPP-MR Film For 2-5 Tb/in2 Read Sensors". IEEE Transactions on Magnetics, vol. 46, No. 6, Jun. 2010, pp. 2086-2089.
Dec. 21, 2020 Search Report issued in European Patent Application No. 20189919.2.
Nov. 4, 2021 Office Action issued in U.S. Appl. No. 16/984,381.
Apr. 4, 2022 Notice of Allowance Issued in U.S. Appl. No. 16/984,381.
Dec. 19, 2022 Office Action Issued in U.S. Appl. No. 17/853,429.
May 11, 2023 Notice of Allowance Issued in U.S. Appl. No. 17/853,429.
Translation of Apr. 27, 2023 Office Action issued in Chinese Application No. 202010777761.3.
Nov. 9, 2023 Office Action issued in European Patent Application No. 20189919.2.
Wang et al., J. App. Phys., 112, 124314, 2012, 9 total pages (Year: 2012).
Apr. 24, 2024 Office Action issued in U.S. Appl. No. 18/240,657.
Mar. 23, 2023 Notice of Allowance issued in U.S. Appl. No. 17/115,283.
Sep. 12, 2019 International Preliminary Report on Patentability issued in International Patent Application No. PCT/JP2018/001187.
Qiu et al. "The influence of oxygen on structure and magnetic properties of full Heusler CO2MnAl films and magentic tunnel junctions." J Appl Phys., 105, 07C932, Apr. 3, 2009.
Shinohara et al. "Methods to induce perpendicular magnetic anisotropy in full-Heusler Co2FeSi thin layers in a magentic tunnel junction structure." AIP Advances, 8, 055923, Jan. 17, 2018.
Wen et al.; "Fully expitaxial C1b-type NiMnSb half-Heusler alloy films for current-perpendicular-to-plane giant magnetoresistance devices with a Ag spacer"; Scientific Reports; vol. 5, 18387; 2015; pp. 1-10.
Kasai et al.; "Large magnetoresistance in Heusler-alloy-based expitaxial magnetic junctions with semiconducting Cu (In0.8Ga0.2)Se2 spacer"; vol. 109, 032409; 2016 pp. 032409-1-032409-4.
Galanakis et al.; "Electronic structure and Slater-Pauling behavior in half-metallic Heusler alloys calculated from first principles"; Journal of Physics D: Applied Physics; vol. 39 765; 2006; pp. 765-775.
Kwon et al.; "Anisotropic magnetoresistance and current-perpendicular-to-plane giant magnetoresistance in expitaxial NiMnSb-based multilayers"; Journal of Applied Physics; vol. 119, 023902; 2016; pp. 023902-1-023902-6.
Yoshio Miura et al.; "First-principles study of ballistic transport properties in Co2MnSi/X/Co2MnSi(001) (X=Ag, Au, Al, V, Cr) trilayers;" Physical Review B; vol. 84; 134432-1-134432-6; 2011.
Mar. 29, 2021 Search Report issued in European Patent Application No. 20189904.4.
Mar. 30, 2022 Office Action issued in U.S. Appl. No. 16/986,431.
Feb. 4, 2021 Ex Parte Quayle Action issued in U.S. Appl. No. 16/984,389.
Jul. 9, 2021 Office Action issued in U.S. Appl. No. 16/984,389.
U.S. Appl. No. 16/984,389, filed Aug. 4, 2020 in the name of Kazuumi Inubushi et al.
Oct. 6, 2022 Office Action issued in U.S. Appl. No. 17/714,237.
Translation of Apr. 23, 2023 Office Action issued in Chinese Patent Application No. 202010784298.5.
Aug. 31, 2023 Office Action issued in U.S. Appl. No. 17/124,643.
Guchang Han et al., "Control of offset field and pinning stability in perpendicular magnetic tunnelling junctions with synthetic antiferromagnetic coupling multilayer", Journal of Applied Physics, vol. 117, 17B515 (2015).
U.S. Appl. No. 17/124,643, filed Dec. 17, 2020 in the name of Minoru Ota et al.
Mar. 16, 2021 Search Report issued in International Patent Application No. PCT/JP2020/047677.
Nov. 15, 2022 Office Action issued in U.S. Appl. No. 17/141,347.
U.S. Appl. No. 18/373,642, filed Sep. 27, 2023 in the name of Ichikawa et al.
Jan. 9, 2019 Office Action issued in U.S. Appl. No. 15/988,707.
Apr. 23, 2019 Office Action issued in U.S. Appl. No. 15/988,707.
Jun. 12, 2019 Notice of Allowance issued in U.S. Appl. No. 15/988,707.
U.S. Appl. No. 18/213,490, filed Jun. 23, 2023 in the name of Inubushi et al.
U.S. Appl. No. 15/988,707, filed May 24, 2018 in the name of Inubushi et al.
May 17, 2019 Office Action issued in U.S. Appl. No. 16/081,192.
U.S. Appl. No. 16/081,192 filed Aug. 30, 2018 in the name of Inubushi et al.
Aug. 28, 2019 Office Action issued in U.S. Appl. No. 16/081,192.
Nov. 4, 2019 Notice of Allowance issued in U.S. Appl. No. 16/081,192.
U.S. Appl. No. 16/081,357, filed Aug. 30, 2018 in the name of Inubushi et al.
Sep. 12, 2019 International Preliminary Report on Patentability issued in Application No. PCT/JP2018/001423.
May 14, 2019 Office Action issued in U.S. Appl. No. 16/081,357.
Aug. 1, 2019 Notice of Allowance issued in U.S. Appl. No. 16/081,357.
Aug. 27, 2020 Office Action issued in U.S. Appl. No. 16/676,920.
U.S. Appl. No. 16/676,920, filed Nov. 19, 2019 in the name of Inubushi et al.
Nov. 16, 2020 Notice of Allowance issued in U.S. Appl. No. 16/676,920.
U.S. Appl. No. 16/777,036, filed Jan. 30, 2020 in the name of Nakada.

* cited by examiner

MAGNETORESISTANCE EFFECT ELEMENT

CROSS-REFERENCE TO RELATED APPLICATION

Priority is claimed on PCT/JP2021/041051, filed with the International Bureau on Nov. 8, 2021, the content of which is incorporated herein by reference.

BACKGROUND

The present invention relates to a magnetoresistance effect element.

A magnetoresistance effect element is an element whose resistance value in a stacking direction changes due to a magnetoresistance effect. A magnetoresistance effect element includes two ferromagnetic layers and a nonmagnetic layer interposed therebetween. A magnetoresistance effect element using a conductor for a nonmagnetic layer is referred to as a giant magnetoresistance (GMR) element, and a magnetoresistance effect element using an insulating layer (a tunnel barrier layer or barrier layer) for a nonmagnetic layer is referred to as a tunnel magnetoresistance (TMR) element. A magnetoresistance effect element can be applied to various purposes such as a magnetic sensor, a radio frequency component, a magnetic head, and a magnetic random access memory (MRAM).

Patent Document 1 describes a magnetic sensor including a magnetoresistance effect element using a Heusler alloy for a ferromagnetic layer. A Heusler alloy has a high spin polarization, and a magnetic sensor using a Heusler alloy is expected to have a large output signal. On the other hand, Patent Document 1 describes that a Heusler alloy is less likely to crystallize unless each layer of the magnetoresistance effect element is formed at a high temperature or on a thick base substrate having a predetermined crystallinity. Patent Document 1 describes that forming each layer of a magnetoresistance effect element at a high temperature or using a thick base substrate can cause a decrease in an output of a magnetic sensor. Patent Document 1 describes that the output of the magnetic sensor increases when the ferromagnetic layer is made to have a stacked structure of an amorphous layer and a crystalline layer.

PATENT DOCUMENTS

[Patent Document 1] U.S. Pat. No. 9,412,399

SUMMARY

The magnitude of the output signal of the magnetic sensor depends on a magnetoresistance change rate (an MR ratio) of the magnetoresistance effect element. In general, the higher the crystallinity of the ferromagnetic layers with the nonmagnetic layer interposed therebetween, the larger the MR ratio tends to be. In the magnetoresistance effect element described in Patent Document 1, the ferromagnetic layers with the nonmagnetic layer interposed therebetween are amorphous, and it is less likely to obtain a sufficiently large MR ratio.

The present disclosure has been made in view of the circumstances described above, and an object the present disclosure is to provide a magnetoresistance effect element capable of realizing a large MR ratio.

The present disclosure provides the following means for solving the above problems.

A magnetoresistance effect element according to a first aspect includes a first ferromagnetic layer, a second ferromagnetic layer, and a nonmagnetic layer. The nonmagnetic layer is between the first ferromagnetic layer and the second ferromagnetic layer. At least one of the first ferromagnetic layer and the second ferromagnetic layer is a Heusler alloy layer. The nonmagnetic layer includes a first region and a second region in a plane. Both of the first region and the second region are formed of a metal. The second region is different in constituent material from the first region. The second region has a crystal structure of a body-centered cubic lattice structure (bcc).

The magnetoresistance effect element according to the present disclosure has a large MR ratio.

DETAILED DESCRIPTION

Figure 1:
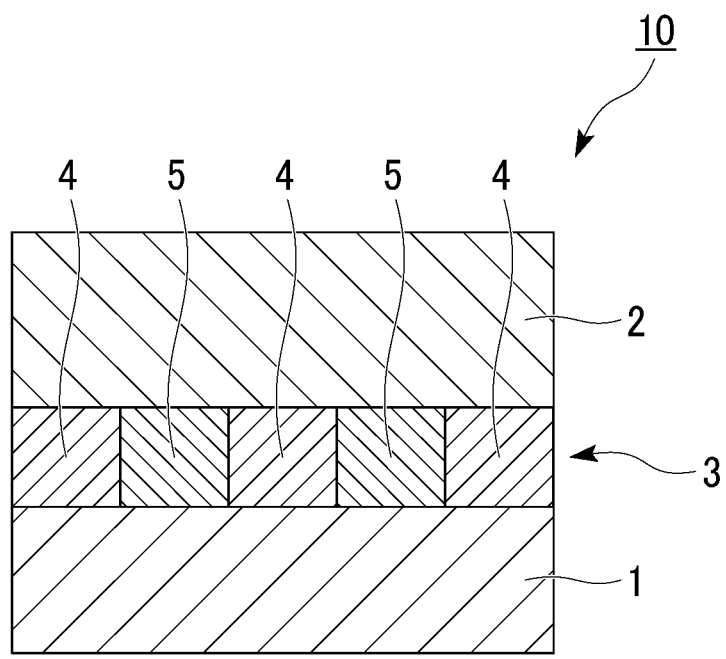
FIG. 1 is a cross-sectional view of a magnetoresistance effect element according to a first embodiment.

Hereinafter, the present embodiment will be described in detail with appropriate reference to the drawings. In the drawings used in the following description, a feature portion may be enlarged for convenience to make a feature of the present embodiment easy to understand, and dimensional ratios of each constituent element and the like may be different from the actual ones. Materials, dimensions, and the like exemplified in the following description are examples, and the present invention is not limited thereto and can be appropriately modified and carried out within the scope in which the gist of the present invention is not changed.

First Embodiment

FIG. 1 is a cross-sectional view of a magnetoresistance effect element according to a first embodiment. First, directions will be defined. A direction in which layers are stacked may be referred to as a stacking direction. Further, a direction which intersects with the stacking direction and in which each layer spreads may be referred to as an in-plane direction.

The magnetoresistance effect element 10 shown in FIG. 1 includes a first ferromagnetic layer 1, a second ferromagnetic layer 2, and a nonmagnetic layer 3.

The magnetoresistance effect element 10 outputs a change in resistance value due to a change in relative angle between magnetization of the first ferromagnetic layer 1 and magnetization of the second ferromagnetic layer 2. The magnetization of the second ferromagnetic layer 2 is, for example, easier to move than the magnetization of the first ferromagnetic layer 1. In a case where a predetermined external force is applied, a magnetization direction of the first ferromagnetic layer 1 does not change (is fixed), and a magnetization direction of the second ferromagnetic layer 2 changes. As the magnetization direction of the second ferromagnetic layer 2 changes with respect to the magnetization direction of the first ferromagnetic layer 1, the resistance value of the magnetoresistance effect element 10 changes. In this case, the first ferromagnetic layer 1 may be referred to as a magnetization fixed layer, and the second ferromagnetic layer 2 may be referred to as a magnetization free layer. Hereinafter, the first ferromagnetic layer 1 will be described as a magnetization fixed layer, and the second ferromagnetic layer 2 will be described as a magnetization free layer, but this relationship may be reversed.

A difference in easiness of movement between the magnetization of the first ferromagnetic layer 1 and the magnetization of the second ferromagnetic layer 2 when a predetermined external force is applied is caused by a difference in coercivity between the first ferromagnetic layer 1 and the second ferromagnetic layer 2. For example, in a case where a thickness of the second ferromagnetic layer 2 is thinner than a thickness of the first ferromagnetic layer 1, the coercivity of the second ferromagnetic layer 2 may often be smaller than the coercivity of the first ferromagnetic layer 1. Further, for example, an antiferromagnetic layer may be provided on a surface of the first ferromagnetic layer 1 opposite to a side of the nonmagnetic layer 3 via a spacer layer. The first ferromagnetic layer 1, the spacer layer, and the antiferromagnetic layer form a synthetic antiferromagnetic structure (SAF structure). The synthetic antiferromagnetic structure is constituted by two magnetic layers with a spacer layer interposed therebetween. The coercivity of the first ferromagnetic layer 1 in a case where the first ferromagnetic layer 1 and the antiferromagnetic layer are antiferromagnetically coupled with each other is larger than the coercivity of the first ferromagnetic layer 1 in a case without the antiferromagnetic layer. The antiferromagnetic layer is formed of, for example, IrMn, PtMn, or the like. The spacer layer contains, for example, at least one selected from the group consisting of Ru, Ir, and Rh.

The first ferromagnetic layer 1 and the second ferromagnetic layer 2 each contain a ferromagnetic material. Both of the first ferromagnetic layer 1 and the second ferromagnetic layer 2 shown in FIG. 1 contain a Heusler alloy layer. For example, the first ferromagnetic layer 1 and the second ferromagnetic layer 2 are each consist of a Heusler alloy layer. The Heusler alloy layer contains a Heusler alloy. At least a part of the Heusler alloy is crystallized. The Heusler alloy may be wholly crystallized, for example.

Whether or not the Heusler alloy is crystallized can be determined with a transmission electron microscope (TEM) image (for example, a high-angle scattering annular dark field scanning transmission microscope image: an HAADF-STEM image) or an electron beam diffraction image using a transmission electron beam. When the Heusler alloy is crystallized, for example, it is possible to check in the HAADF-STEM image that atoms are arranged regularly. More specifically, a spot derived from a crystal structure of the Heusler alloy appears in a Fourier transform image of the HAADF-STEM image. Further, when the Heusler alloy is crystallized, a diffraction spot can be checked from at least one plane of a (001) plane, a (002) plane, a (110) plane, a (111) plane, and a (011) plane in the electron beam diffraction image. In a case where crystallization can be checked by at least any means, it can be said that at least a part of the Heusler alloy is crystallized.

In the Heusler alloy layer, crystals are mainly oriented (or preferentially oriented) in a (001) or (011) direction, for example. Being mainly oriented in the (001) or (011) direction means that a main crystal direction of the crystals forming the Heusler alloy layer is the (001) or (011) direction. For example, in a case where the Heusler alloy layer is formed of a plurality of crystal grains, crystal directions of the crystal grains may differ. In this case, when a direction of a synthetic vector of a crystal orientation direction in each crystal grain is within a range of inclination of 25° or less with respect to the (001) direction, it can be said that the crystals are mainly oriented in the (001) direction. The same applies to the (011) direction. The Heusler alloy layer in which the orientation directions of the constituent crystals are aligned has a high crystallinity, and an MR ratio of the magnetoresistance effect element 10 including this Heusler alloy is high. Further, an orientation direction that is considered to be equivalent to the (001) direction is also included in a (001) orientation. That is, the (001) orientation includes a (001) orientation, a (010) orientation, a (100) orientation, and all orientation directions opposite thereto.

A Heusler alloy is an intermetallic compound with an XYZ or $X_2YZ$ chemical composition. A ferromagnetic Heusler alloy represented by $X_2YZ$ is referred to as a full-Heusler alloy, and a ferromagnetic Heusler alloy represented by XYZ is referred to as a half-Heusler alloy. The half-Heusler alloy is obtained by making some of X-site atoms in the full-Heusler alloy vacant. Both are typically intermetallic compounds based on a bcc structure.

Figure 2A:
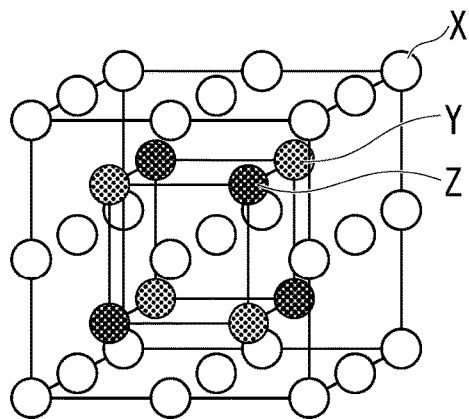
FIG. 2A is a view showing a crystal structure of a Heusler alloy.
Figure 2D:
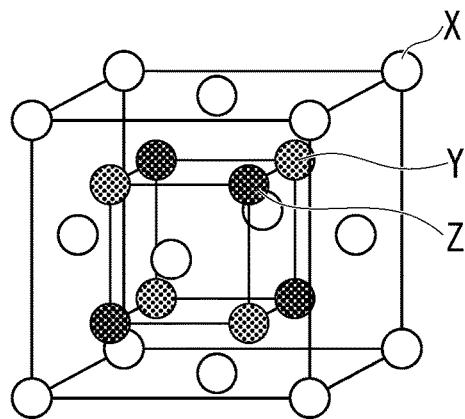
FIG. 2D is a view showing a crystal structure of a Heusler alloy.
Figure 2B:
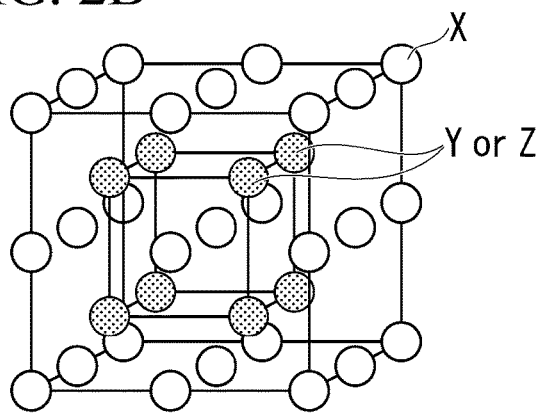
FIG. 2B is a view showing a crystal structure of a Heusler alloy.
Figure 2E:
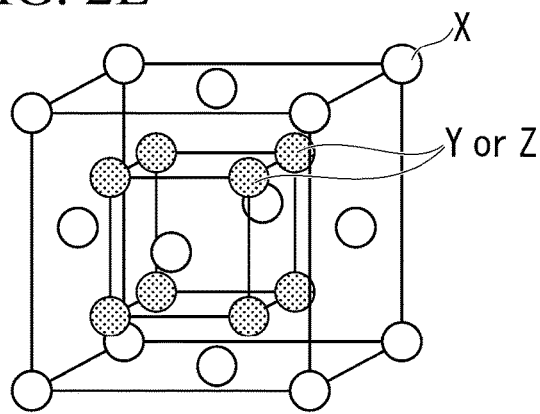
FIG. 2E is a view showing a crystal structure of a Heusler alloy.
Figure 2C:
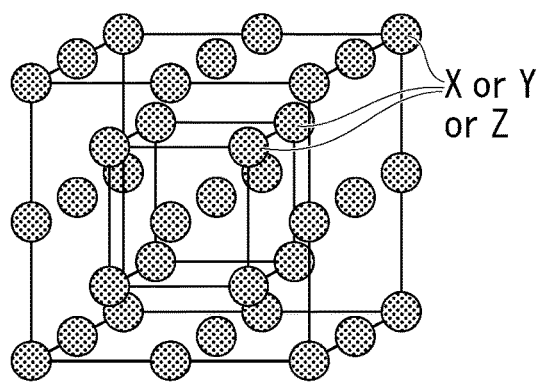
FIG. 2C is a view showing a crystal structure of a Heusler alloy.
Figure 2F:
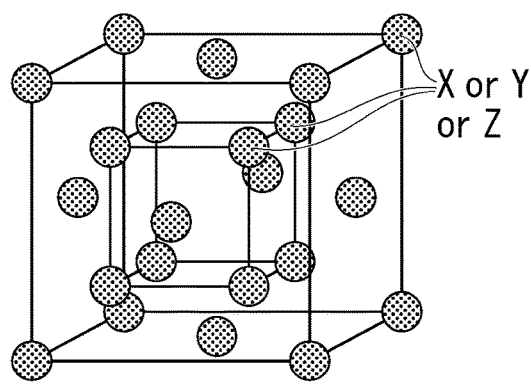
FIG. 2F is a view showing a crystal structure of a Heusler alloy.

FIGS. 2A to 2F show examples of the crystal structure of the Heusler alloy. FIGS. 2A, 2B, and 2C are examples of the crystal structure of the full-Heusler alloy, and FIGS. 2D, 2E, and 2F are examples of the crystal structure of the half-Heusler alloy.

FIG. 2A is referred to as an $L2_1$ structure. In the $L2_1$ structure, an element entering an X site, an element entering the Y site, and an element entering the Z site are fixed. FIG. 2B is referred to as a B2 structure derived from the $L2_1$ structure. In the B2 structure, an element entering a Y site and an element entering a Z site are mixed with each other, and an element entering the X site is fixed. FIG. 2C is referred to as an A2 structure derived from the $L2_1$ structure. In the A2 structure, an element entering an X site, an element entering a Y site, and an element entering a Z site are mixed with each other.

FIG. 2D is referred to as a $C1_b$ structure. In the $C1_b$ structure, an element entering an X site, an element entering the Y site, and an element entering the Z site are fixed. FIG.

2E is referred to as a B2 structure derived from the $C1_b$ structure. In the B2 structure, an element entering a Y site and an element entering a Z site are mixed with each other, and an element entering the X site is fixed. FIG. 2F is referred to as an A2 structure derived from the $C1_b$ structure. In the A2 structure, an element entering an X site, an element entering a Y site, and an element entering a Z site are mixed with each other.

A crystallinity of the full-Heusler alloy is higher in the order of $L2_1$ structure>B2 structure>A2 structure, and a crystallinity of the half-Heusler alloy is higher in the order of $C1_b$ structure>B2 structure>A2 structure. All of these crystal structures are crystals, although they differ in crystallinity. Therefore, the first ferromagnetic layer 1 and the second ferromagnetic layer 2 each have, for example, any of the crystal structures described above. Each crystal structure of the first ferromagnetic layer 1 and the second ferromagnetic layer 2 is, for example, the $L2_1$ structure or the B2 structure.

Here, X is a transition metal element or noble metal element from the Co, Fe, Ni, or Cu group in the periodic table, Y is a transition metal element from the Mn, V, Cr, or Ti group in the periodic table or the same type of element as for X, and Z is a typical element from Groups III to V in the periodic table. The full-Heusler alloy is, for example, $Co_2FeSi$, $Co_2FeAl$, $Co_2FeGe_xGa_{1-x}$, $Co_2MnGe_xGa_{1-x}$, $Co_2MnSi$, $Co_2MnGe$, $Co_2MnGa$, $Co_2MnSn$, $Co_2MnAl$, $Co_2CrAl$, $Co_2VAl$, $Co_2Mn_{1-a}Fe_aAl_bSi_{1-b}$, or the like. The half-Heusler alloy is, for example, NiMnSe, NiMnTe, NiMnSb, PtMnSb, PdMnSb, CoFeSb, NiFeSb, RhMnSb, CoMnSb, IrMnSb, or NiCrSb.

The composition of the Heusler alloy layer can be determined using energy dispersive X-ray spectroscopy (EDS). Further, by performing the EDS, for example, the composition distribution of each material in a film thickness direction can be checked. Compositions of layers other than the Heusler alloy layer of the magnetoresistance effect element 10 can also be similarly evaluated using the EDS.

The Heusler alloy contained in the Heusler alloy layer may be represented by, for example, $Co_2Y_\alpha Z_\beta$. Y is, for example, one or more elements selected from the group consisting of Fe, Mn, and Cr. Z is, for example, one or more elements selected from the group consisting of Si, Al, Ga, and Ge. $\alpha+\beta>2$ is satisfied. Y is particularly preferably Fe, and Z is particularly preferably Ga and Ge. For example, in $\alpha$, $0.3<\alpha<2.1$ is satisfied, and more preferably $0.4<\alpha<2.0$ is satisfied. In $\beta$, $0.1 \leq \beta \leq 2.0$ is satisfied.

The full-Heusler alloy in stoichiometric composition is represented by $Co_2YZ$. When $\alpha+\beta>2$ is satisfied, the Co compositional proportion becomes relatively smaller than the sum of the compositional proportions of the elements on the Y site and the Z site. When the Co compositional proportion is relatively smaller than the sum of the compositional proportions of the Y-site and Z-site elements, it is possible to avoid an anti-site in which the Y-site and Z-site elements are substituted with the X-site element (Co). The anti-site causes a Fermi level of the Hensler alloy to fluctuate. When the Fermi level fluctuates, a half-metallicity of the Heusler alloy decreases, and a spin polarization of the Heusler alloy decreases. A decrease in spin polarization causes a decrease in the MR ratio of the magnetoresistance effect element 10.

The Heusler alloy contained in the Heusler alloy layer may be represented by, for example, $Co_2Fe_\alpha Ga_{\beta 1}Ge_{\beta 2}$. In the composition formula, $\alpha+\beta 1+\beta 2>2.3$, $\alpha<\beta 1+\beta 2$, $0.5<\alpha<1.9$, $0.1 \leq \beta 1$, and $0.1 \leq \beta 2$ may be satisfied.

The nonmagnetic layer 3 is interposed between the first ferromagnetic layer 1 and the second ferromagnetic layer 2. The nonmagnetic layer 3 has a thickness, for example, within a range of 1 nm or more and 10 nm or less. The nonmagnetic layer 3 inhibits magnetic coupling between the first ferromagnetic layer 1 and the second ferromagnetic layer 2.

The nonmagnetic layer 3 includes a first region 4 and a second region 5. The first region 4 and the second region 5 are located at different positions in the in-plane direction. A part of each of the first region 4 and the second region 5 may overlap each other in the stacking direction. At least a part of the second region 5 penetrates the nonmagnetic layer 3 in the stacking direction. At least part of the second region 5 extends, for example, from a first surface of the nonmagnetic layer 3 to a second surface facing the first surface.

Figure 3:
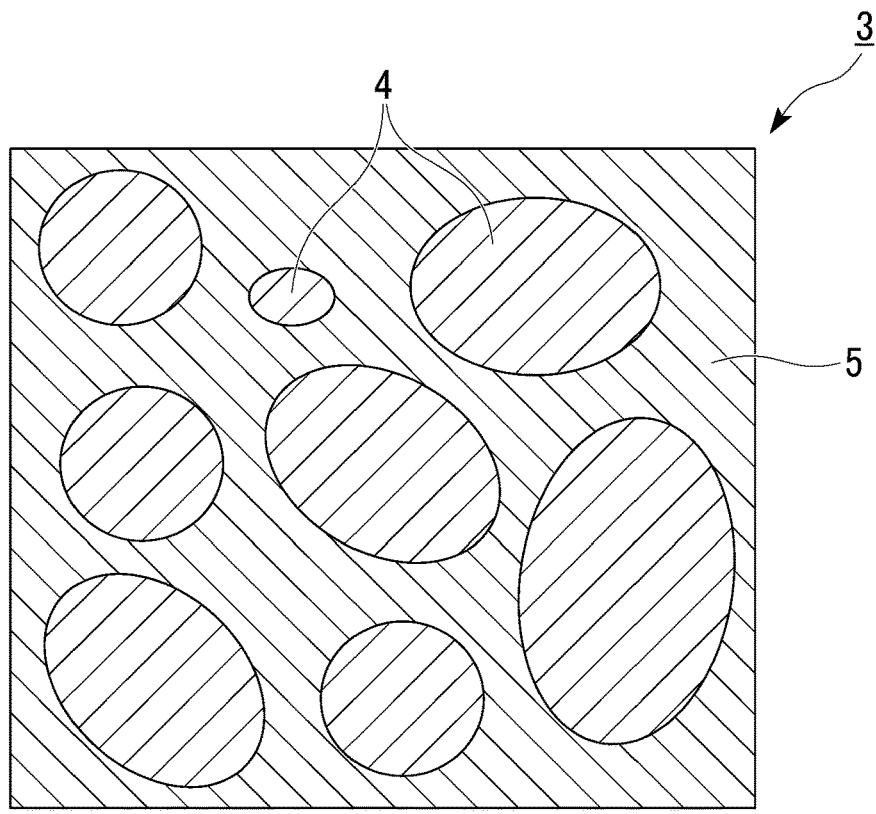
FIG. 3 is a cross-sectional view of the magnetoresistance effect element according to the first embodiment along a plane passing through a second nonmagnetic layer in an in-plane direction.
Figure 4:
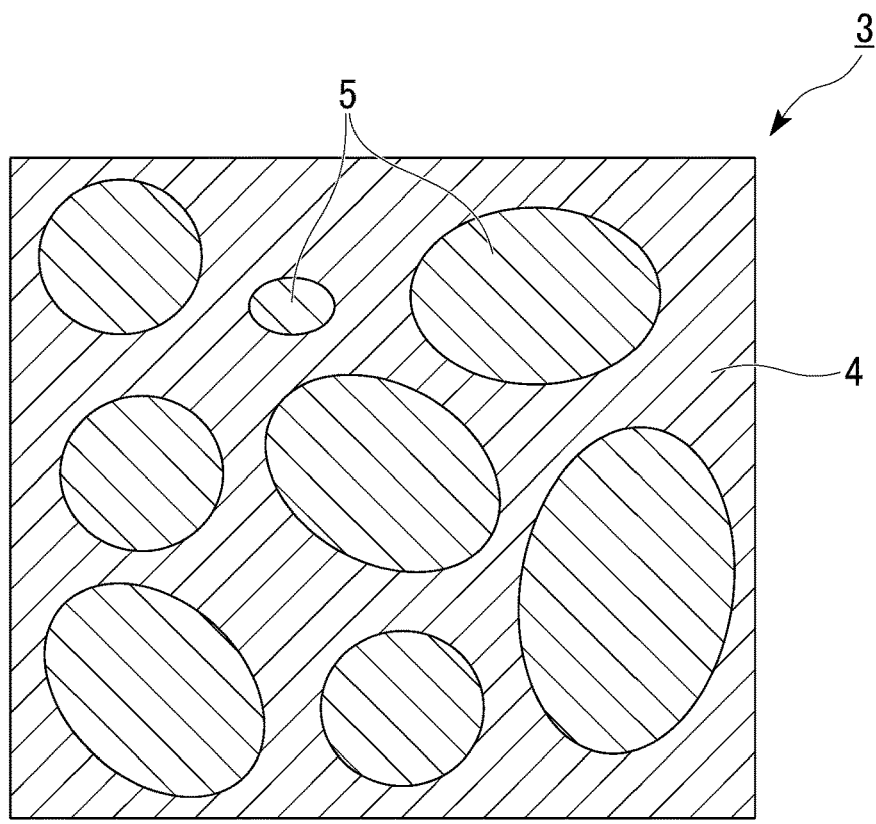
FIG. 4 is a cross-sectional view of another example of the magnetoresistance effect element according to the first embodiment along a plane passing through a second nonmagnetic layer in an in-plane direction.

FIG. 3 is a cross-sectional view of the magnetoresistance effect element 10 according to the first embodiment along a plane passing through the nonmagnetic layer 3 in the in-plane direction. In the example shown in FIG. 3, the first region 4 is scattered within the second regions 5. The relationship between the first region 4 and the second region 5 may be reversed as shown in FIG. 4. That is, the second region 5 may be scattered within the first region 4. FIG. 4 is a cross-sectional view of another example of the magnetoresistance effect element 10 according to the first embodiment along a plane passing through the nonmagnetic layer 3 in the in-plane direction.

Both of the first region 4 and the second region 5 are formed of a metal. The metal is not limited to a single metal and includes an alloy.

The first region 4 contains, for example, a nonmagnetic metal. The first region 4 is formed of, for example, a metal or alloy containing any element selected from the group consisting of Cu, Au, Ag, Al, and Cr. The metal or alloy containing these elements are excellent in electrical conductivity and reduce the area resistance (hereinafter referred to as RA) of the magnetoresistance effect element 10. The first region 4 contains, for example, any element selected from the group consisting of Cu, Au, Ag, Al, and Cr as a main constituent element. The main constituent element means that the proportion of Cu, Au, Ag, Al, and Cr in the composition formula is 50% or more. The first region 4 preferably contains Ag and preferably contains Ag as a main constituent element. Since Ag has a long spin diffusion length, the magnetoresistance effect element 10 using Ag shows a large MR ratio.

The crystal structure of the first region 4 is preferably a body-centered cubic lattice structure (bcc), for example. For example, Ag is likely to have a crystal structure of the bcc. When the crystal structure of the first region 4 is the bcc, lattice matching between the first region 4 and the Heusler alloy layer is facilitated. A degree of the lattice matching is represented by a lattice matching degree. The lattice matching degree is a degree of deviation of a lattice constant of a second layer with a lattice constant of a first layer as a reference. The lattice matching degree is obtained by dividing the deviation between the lattice constant of the first layer and the second layer by the lattice constant of the first layer and multiplying by 100. In this case, the first layer is the Heusler alloy layer, and the second layer is the first region. The lattice matching degree represents that the smaller a value (deviation in lattice constant), the more lattice matching between the two layers. The lattice matching degree between the first region 4 and the Heusler alloy layer is preferably 4% or less.

The second region 5 contains, for example, a nonmagnetic metal. The second region 5 is formed of a material different from that of the first region 4. The second region 5 contains any element selected from the group consisting of Mg, V, Cr, Nb, Mo, Ta, and W, for example. The second region 5 contains an alloy containing V or Cr, for example. The second region 5 is formed of NiV or NiCr, for example.

The crystal structure of the second region 5 is a body-centered cubic lattice structure (bcc). When the crystal structure of the second region 5 is the bcc, lattice matching between the second region 5 and the Heusler alloy layer is facilitated. The lattice matching degree between the second region 5 and the Heusler alloy layer is preferably 4% or less.

The proportion of the second region 5 in the nonmagnetic layer 3 is, for example, 10% or more and 70% or less, and preferably 10% or more and 50% or less. The proportion of the second region 5 in the nonmagnetic layer 3 can be obtained, for example, by cutting the magnetoresistance effect element 10 in the stacking direction, analyzing the composition of the cut surface, and dividing an area of the second region 5 by an area of the nonmagnetic layer 3 in the cut surface.

The magnetoresistance effect element 10 may have a layer other than the first ferromagnetic layer 1, the second ferromagnetic layer 2, and the nonmagnetic layer 3 described above. For example, a surface of the first ferromagnetic layer 1 opposite to the nonmagnetic layer 3 may have a base layer, and a surface of the second ferromagnetic layer 2 opposite to the nonmagnetic layer 3 may have a cap layer. The base layer and the cap layer enhance the crystal orientation of the first ferromagnetic layer 1 and the second ferromagnetic layer 2. The base layer and the cap layer each contain, for example, Ru, Ir, Ta, Ti, Al, Au, Ag, Pt, or Cu. Further, a buffer layer may be provided between the first ferromagnetic layer 1 and the nonmagnetic layer 3 or between the second ferromagnetic layer 2 and the nonmagnetic layer 3. The buffer layer is, for example, a NiAl layer. The buffer layer enhances the lattice matching of these interfaces.

Next, a method of manufacturing the magnetoresistance effect element 10 will be described. First, a substrate that serves as a base for film formation is prepared. The substrate may be crystalline or amorphous. Examples of a crystalline substrate include metal oxide single crystals, silicon single crystals, and sapphire single crystals. Examples of an amorphous substrate include silicon single crystals with a thermal oxide film, glass, ceramics, and quartz.

Next, the first ferromagnetic layer 1 is stacked on the substrate. The first ferromagnetic layer 1 is formed by a sputtering method, for example.

Next, the material forming the first region 4 and the material forming the second region 5 are simultaneously sputtered onto the first ferromagnetic layer. The material forming the first region 4 is Ag, for example. The material forming the second region 5 is, for example, NiCr or NiV. These materials are incompatible and phase separate. The first region 4 and the second region 5 are formed by phase separation. In order to prevent the compatibility between these materials, the sputtering temperature is preferably 1000° C. or less.

Here, an example in which the material forming the first region 4 and the material forming the second region 5 are sputtered at the same time to form the first region 4 and the second region 5 at the same time has been illustrated, but the first region 4 and the second region 5 may be formed separately.

In a case where the first region 4 and the second region 5 are formed separately, first, a film of the material forming the first region 4 is formed by heating. When a film of the material forming the first region 4 is formed by heating, the material aggregates due to heat and is scattered in an island shape to form the first region 4. The temperature for film formation by heating is, for example, 300° C. or less and preferably 200° C. or more and 300° C. or less. Further, when a film of the material forming the first region 4 is formed by heating, additive elements such as Ga, In, and Zn may be added to a target. When the target contains these additive elements, the temperature for film formation by heating can be lowered.

When the first region 4 is formed, a film of the material forming the second regions 5 is formed to cover the scattered first region 4. This film formation may be normal temperature film formation. The material forming the second regions 5 fills a space between the scattered first regions 4 to form the second region 5. Next, the material forming the second region 5 formed on the first region 4 is removed, and thus the nonmagnetic layer 3 is obtained. The material forming the second region 5 formed on the first region 4 can be removed by, for example, chemical mechanical polishing (CMP), ion beam irradiation in a nearly horizontal direction, or the like.

Here, an example in which a film of the material forming the first region 4 is formed by heating and then a film of the material forming the second region 5 is formed at a normal temperature is shown, but it is also possible that a film of the material forming the second region 5 is formed by heating and then a film of the material forming the first region 4 is formed at a normal temperature.

Next, the second ferromagnetic layer 2 is formed on the nonmagnetic layer 3 constituted by the first region 4 and the second region 5. For example, the second ferromagnetic layer 2 is formed of a Heusler alloy. The second ferromagnetic layer 2 is formed by a sputtering method, for example.

Next, the stacked body stacked on the substrate Sub is annealed. The temperature for annealing is, for example, 300° C. or less and is, for example, 250° C. or more and 300° C. or less.

When the stacked body is annealed, the first ferromagnetic layer 1 and the second ferromagnetic layer 2 are crystallized. Due to the presence of the second region 5, the first ferromagnetic layer 1 and the second ferromagnetic layer 2 are crystallized even at a low annealing temperature. The second region 5 has a bcc structure. The crystal structure of the Heusler alloy is similar to the bcc structure. When the atoms of the first ferromagnetic layer 1 and the second ferromagnetic layer 2 are rearranged by annealing, the atoms forming the first ferromagnetic layer 1 and the second ferromagnetic layer 2 are arranged under the influence of the second region 5 having the bcc structure. As a result, regular arrangement of the first ferromagnetic layer 1 and the second ferromagnetic layer 2 is promoted, and the first ferromagnetic layer 1 and the second ferromagnetic layer 2 are crystallized even at a low temperature.

As described above, if the nonmagnetic layer 3 has the second region 5, the Heusler alloy can be crystallized regardless of the crystal structure of the base. Here, the above method has been introduced as one of processes of the method of manufacturing the magnetoresistance effect element 10, but the above method can also be applied to a method of crystallizing a single ferromagnetic layer. For example, a Heusler alloy having a crystallinity can be obtained by stacking a bcc structure layer on a Heusler alloy layer and heating them.

In the method of manufacturing the magnetoresistance effect element 10 according to the present embodiment, the first ferromagnetic layer 1 and the second ferromagnetic layer 2 are crystallized at a low temperature of 300° C. or less. If the temperature is 300° C. or less, even though the annealing is performed after other constituent elements of the magnetic head are manufactured, adverse effects on the other constituent elements (for example, a magnetic shield) can be reduced. Therefore, the timing of annealing is not restricted, and the manufacturing of elements such as magnetic heads is facilitated.

Further, in the magnetoresistance effect element 10 according to the present embodiment, the first ferromagnetic layer 1 and the second ferromagnetic layer 2 with the nonmagnetic layer 3 interposed therebetween are crystallized. Therefore, the first ferromagnetic layer 1 and the second ferromagnetic layer 2 have high spin polarization. As a result, the magnetoresistance effect element 10 according to the present embodiment shows a high MR ratio.

As described above, the embodiment of the present invention have been described in detail with reference to the drawings, but the constituent elements and a combination of these of the embodiment are examples, and addition, omission, replacement, and other changes in configuration can be made without departing from the spirit of the present invention.

For example, only one of the first ferromagnetic layer 1 and the second ferromagnetic layer 2 may have a Heusler alloy layer.

The magnetoresistance effect element 10 described above can be used for various purposes. The magnetoresistance effect element 10 can be applied to, for example, a magnetic head, a magnetic sensor, a magnetic memory, a radio frequency filter, and the like.

Next, application examples of the magnetoresistance effect element according to the present embodiment will be described. In the application examples below, the magnetoresistance effect element 10 is used, but the magnetoresistance effect element is not limited to this.

Figure 5:
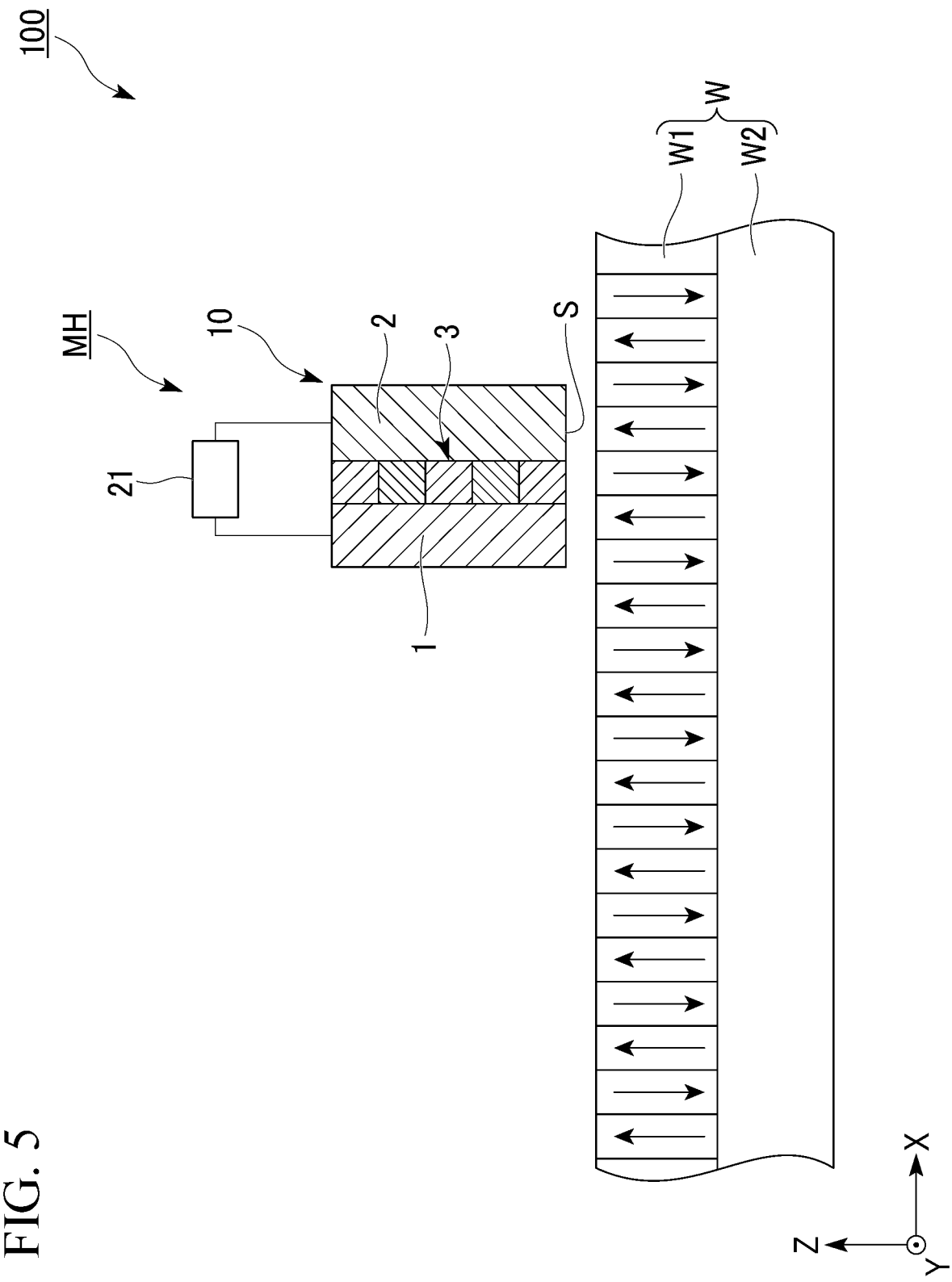
FIG. 5 is a cross-sectional view of a magnetic recording element according to Application Example 1.

FIG. 5 is a cross-sectional view of a magnetic recording element 100 according to Application Example 1. FIG. 5 is a cross-sectional view of the magnetoresistance effect element 10 in the stacking direction.

As shown in FIG. 5, the magnetic recording element 100 has a magnetic head MH and a magnetic recording medium W. In FIG. 5, one direction in which the magnetic recording medium W extends is defined as an X direction, and a direction perpendicular to the X direction is defined as a Y direction. An XY plane is parallel to a main surface of the magnetic recording medium W. A direction in which the magnetic recording medium W and the magnetic head MH are connected to each other and which is perpendicular to the XY plane is defined as a Z direction.

The magnetic head MH has an air bearing surface (a medium facing surface) S that faces a surface of the magnetic recording medium W. The magnetic head MH moves along the surface of the magnetic recording medium W in directions of arrows +X and −X at a position away from the magnetic recording medium W by a certain distance. The magnetic head MH has the magnetoresistance effect element 10 serving as a magnetic sensor and a magnetic recording part (not shown). A resistance measuring device 21 measures a resistance value of the magnetoresistance effect element 10 in the stacking direction.

The magnetic recording part applies a magnetic field to a recording layer W1 of the magnetic recording medium W to determine a magnetization direction of the recording layer W1. That is, the magnetic recording part performs magnetic recording on the magnetic recording medium W. The magnetoresistance effect element 10 reads magnetization information of the recording layer W1 which is written by the magnetic recording part.

The magnetic recording medium W has a recording layer W1 and a backing layer W2. The recording layer W1 is a portion for performing magnetic recording, and the backing layer W2 is a magnetic path (a path of a magnetic flux) for returning a magnetic flux for writing back to the magnetic head MH. The recording layer W1 records magnetic information in the magnetization direction.

The second ferromagnetic layer 2 of the magnetoresistance effect element 10 is, for example, a magnetization free layer. Therefore, the second ferromagnetic layer 2 exposed on the air bearing surface S is affected by the magnetization recorded in the recording layer W1 of the facing magnetic recording medium W. For example, in FIG. 5, the magnetization direction of the second ferromagnetic layer 2 is oriented in a +Z direction under the influence of the +Z direction magnetization of the recording layer W1. In this case, the magnetization directions of the first ferromagnetic layer 1 and the second ferromagnetic layer 2, which are magnetization fixed layers, are in parallel.

Here, the resistance in a case where the magnetization directions of the first ferromagnetic layer 1 and the second ferromagnetic layer 2 are in parallel and the resistance in a case where the magnetization directions of the first ferromagnetic layer 1 and the second ferromagnetic layer 2 are in anti-parallel are different from each other. The MR ratio of the magnetoresistance effect element 10 increases as the difference between the resistance value in the parallel case and the resistance value in the anti-parallel case increases. The magnetoresistance effect element 10 according to the present embodiment contains a crystallized Heusler alloy and has a large MR ratio. Therefore, the magnetization information of the recording layer W1 can be accurately read as a resistance value change by the resistance measuring device 21.

The shape of the magnetoresistance effect element 10 of the magnetic head MH is not particularly limited. For example, the first ferromagnetic layer 1 may be placed at a position away from the magnetic recording medium W in order to avoid the influence of the leakage magnetic field of the magnetic recording medium W on the first ferromagnetic layer 1 of the magnetoresistance effect element 10.

Figure 6:
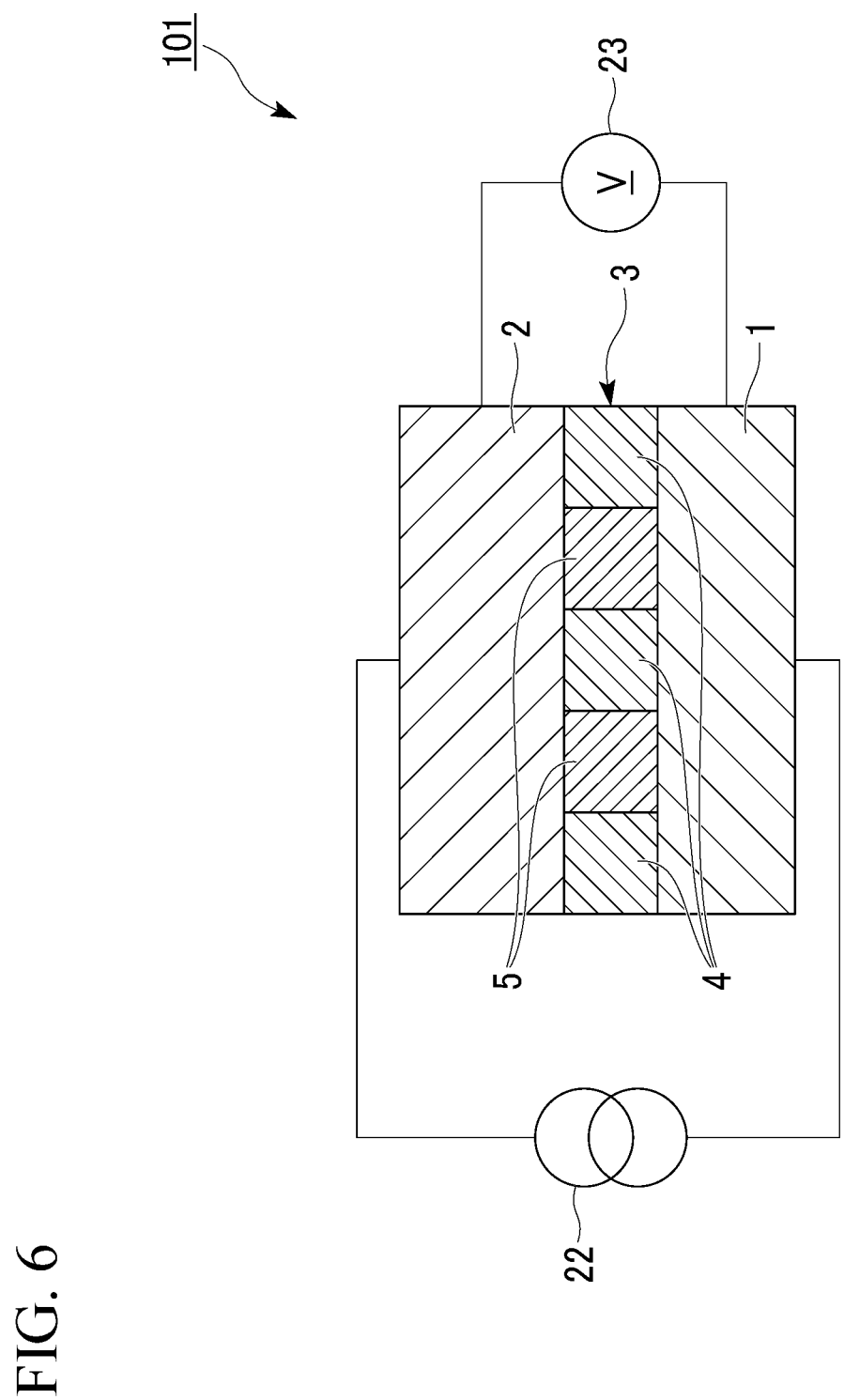
FIG. 6 is a cross-sectional view of a magnetic recording element according to Application Example 2.

FIG. 6 is a cross-sectional view of a magnetic recording element 101 according to Application Example 2. FIG. 6 is a cross-sectional view of the magnetic recording element 101 in the stacking direction.

As shown in FIG. 6, the magnetic recording element 101 has the magnetoresistance effect element 10, a power supply 22, and a measuring part 23. A power supply 22 applies a potential difference in the stacking direction of the magnetoresistance effect element 10. The power supply 22 is, for example, a DC power supply. The measuring part 23 measures a resistance value of the magnetoresistance effect element 10 in the stacking direction.

When the potential difference is generated between the first ferromagnetic layer 1 and the second ferromagnetic layer 2 by the power supply 22, a current flows in the stacking direction of the magnetoresistance effect element 10. The current is spin-polarized when passing through the first ferromagnetic layer 1 and becomes a spin-polarized current. The spin-polarized current reaches the second ferromagnetic layer 2 through the nonmagnetic layer 3. The second ferromagnetic layer 2 receives a spin transfer torque (STT) due to the spin-polarized current and is subjected to magnetization reversal. As a relative angle between the magnetization direction of the first ferromagnetic layer 1 and the magnetization direction of the second ferromagnetic layer 2 changes, the resistance value of the magnetoresistance effect element 10 in the stacking direction changes. The resistance value of the magnetoresistance effect element 10 in the stacking direction is read by the measuring part 23. That is, the magnetic recording element 101 shown in FIG. 6 is a spin transfer torque (STT) type magnetic recording element.

Since the magnetic recording element 101 shown in FIG. 6 includes the magnetoresistance effect element 10 containing a crystallized Heusler alloy and having a large MR ratio, the magnetic recording element 101 can accurately record data.

Figure 7:
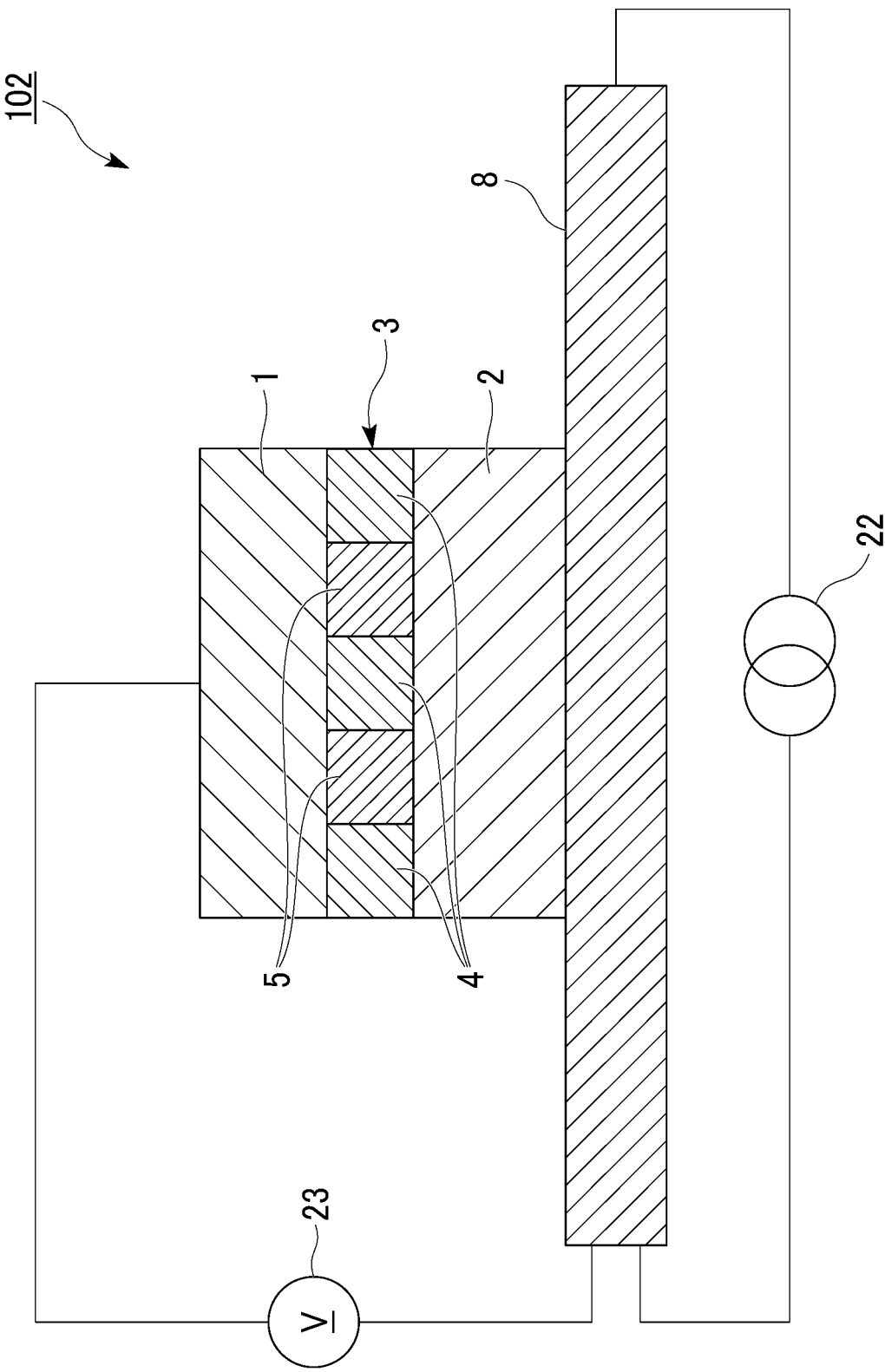
FIG. 7 is a cross-sectional view of a magnetic recording element according to Application Example 3.

FIG. 7 is a cross-sectional view of a magnetic recording element 102 according to Application Example 3. FIG. 7 is a cross-sectional view of the magnetic recording element 102 in the stacking direction.

As shown in FIG. 7, the magnetic recording element 102 has the magnetoresistance effect element 10, a spin-orbit torque wiring 8, a power supply 22, and a measuring part 23. The spin-orbit torque wiring 8 is in contact with the second ferromagnetic layer 2, for example. The spin-orbit torque wiring 8 extends in one direction in the in-plane direction. The power supply 22 is connected to a first end and a second end of the spin-orbit torque wiring 8. The magnetoresistance effect element 10 is interposed between the first end and the second end in a plan view. The power supply 22 causes a write current to flow along the spin-orbit torque wiring 8. The measuring part 23 measures a resistance value of the magnetoresistance effect element 10 in the stacking direction.

When a potential difference is generated between the first end and the second end of the spin-orbit torque wiring 8 by the power supply 22, a current flows in the in-plane direction of the spin-orbit torque wiring 8. The spin-orbit torque wiring 8 has a function of generating a spin current due to a spin Hall effect occurring when a current flows. The spin-orbit torque wiring 8 contains, for example, any one of a metal, an alloy, an intermetallic compound, a metal boride, a metal carbide, a metal silicide, and a metal phosphate which have a function of generating a spin current due to a spin Hall effect occurring when a current flows. For example, the wiring includes a nonmagnetic metal having a d-electron or an f-electron in the outermost shell and having an atomic number equal to or more than 39.

When a current flows in the in-plane direction of the spin-orbit torque wiring 8, the spin-orbit interaction causes a spin Hall effect. The spin Hall effect is a phenomenon in which spins are bent in a direction orthogonal to a flow direction of the current. The spin Hall effect causes uneven distribution of the spins in the spin-orbit torque wiring 8 and induces a spin current in a thickness direction of the spin-orbit torque wiring 8. The spins are injected into the second ferromagnetic layer 2 from the spin-orbit torque wiring 8 with the spin current.

Due to the spins injected into the second ferromagnetic layer 2, a spin-orbital torque (SOT) is applied to the magnetization of the second ferromagnetic layer 2. The magnetization of second ferromagnetic layer 2 is reversed by the spin-orbit torque (SOT). As a relative angle between the magnetization direction of the first ferromagnetic layer 1 and the magnetization direction of the second ferromagnetic layer 2 changes, the resistance value of the magnetoresistance effect element 10 in the stacking direction changes. The resistance value of the magnetoresistance effect element 10 in the stacking direction is read by the measuring part 23. That is, the magnetic recording element 102 shown in FIG. 7 is a spin-orbit torque (SOT) type magnetic recording element.

Since the magnetic recording element 102 shown in FIG. 7 includes the magnetoresistance effect element 10 containing a crystallized Heusler alloy and having a large MR ratio, the magnetic recording element 102 can accurately record data.

Figure 8:
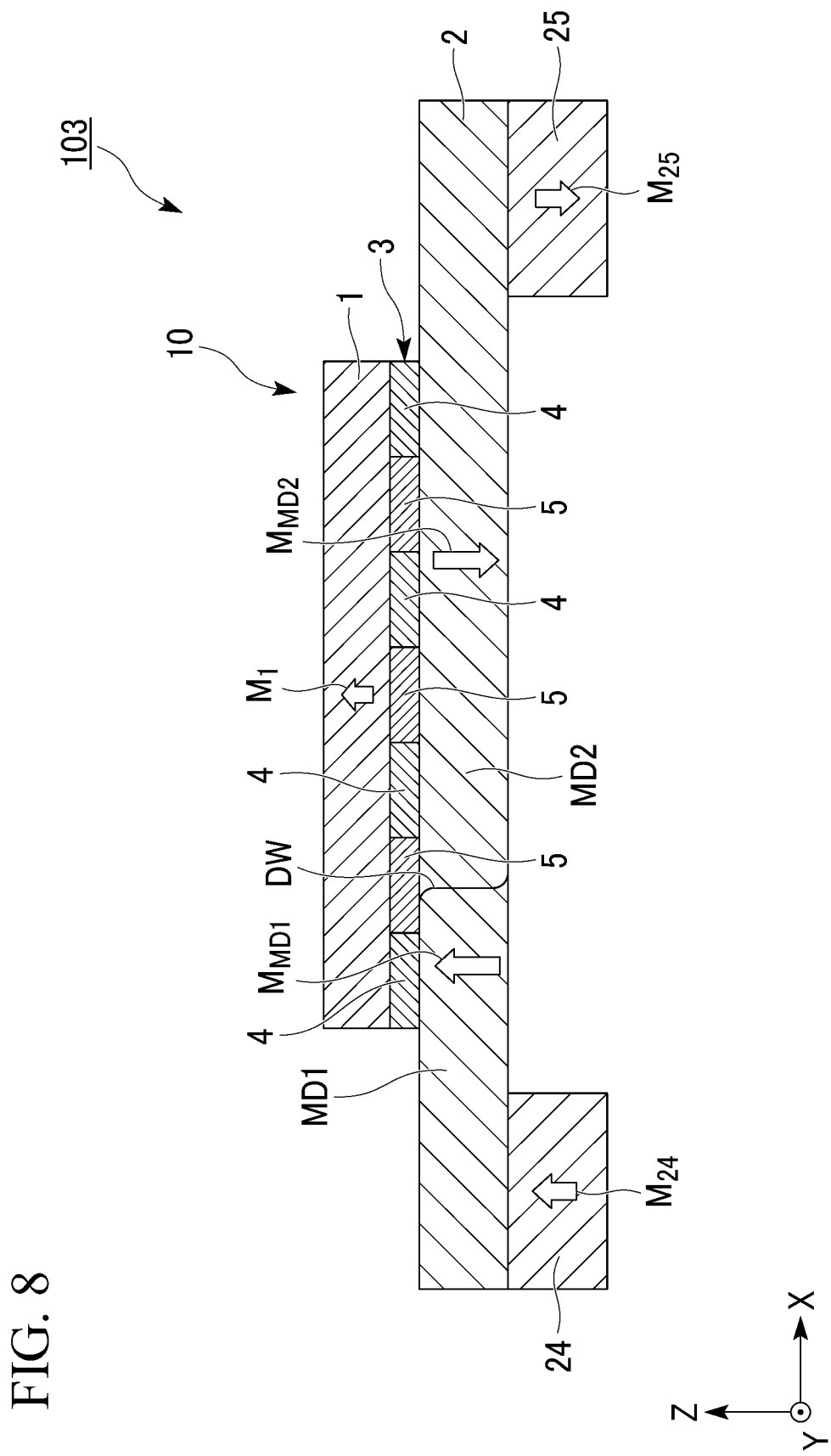
FIG. 8 is a cross-sectional view of a magnetic domain wall movement element according to Application Example 4.

FIG. 8 is a cross-sectional view of a magnetic domain wall movement element (a magnetic domain wall displacement type magnetic recording element) according to Application Example 4. The magnetic domain wall movement element 103 has the magnetoresistance effect element 10, a first magnetization fixed layer 24, and a second magnetization fixed layer 25. The magnetoresistance effect element 10 is constituted by the first ferromagnetic layer 1, the second ferromagnetic layer 2, and the nonmagnetic layer 3. In FIG. 8, a direction in which the first ferromagnetic layer 1 extends is defined as an X direction, a direction perpendicular to the X direction is defined as a Y direction, and a direction perpendicular to an XY plane is defined as a Z direction.

The first magnetization fixed layer 24 and the second magnetization fixed layer 25 are connected to a first end and a second end of the second ferromagnetic layer 2. The first ferromagnetic layer 1 and the nonmagnetic layer 3 are interposed between the first end and the second end in the X direction.

The second ferromagnetic layer 2 is a layer capable of magnetically recording information by changing an internal magnetic state. The second ferromagnetic layer 2 has a first magnetic domain MD1 and a second magnetic domain MD2 inside. The magnetization of a portion of the second ferromagnetic layer 2 overlapping the first magnetization fixed layer 24 or the second magnetization fixed layer 25 in the Z direction is fixed in one direction. The magnetization of a portion of the second ferromagnetic layer 2 overlapping the first magnetization fixed layer 24 in the Z direction is fixed, for example, in a +Z direction, and the magnetization of a portion of the second ferromagnetic layer 2 overlapping the second magnetization fixed layer 25 in the Z direction is fixed, for example, in a −Z direction. As a result, a magnetic domain wall DW is formed at a boundary between the first magnetic domain MD1 and the second magnetic domain MD2. The second ferromagnetic layer 2 can have the magnetic domain wall DW inside. In the second ferromagnetic layer 2 shown in FIG. 8, the magnetization $M_{MD1}$ of the first magnetic domain MD1 is oriented in the +Z direction, and the magnetization $M_{MD2}$ of the second magnetic domain MD2 is oriented in the −Z direction.

The magnetic domain wall movement element 103 can record data in multiple values or continuously depending on a position of the magnetic domain wall DW of the second ferromagnetic layer 2. The data recorded on the second ferromagnetic layer 2 is read as a change in resistance value of the magnetic domain wall movement element 103 when a read current is applied.

A ratio between the first magnetic domain MD1 and the second magnetic domain MD2 in the second ferromagnetic layer 2 changes as the magnetic domain wall DW moves. The magnetization $M_1$ of the first ferromagnetic layer 1 is, for example, in the same direction as (parallel to) the magnetization MMDI of the first magnetic domain MD1 and in a direction opposite to (anti-parallel to) the magnetization $M_{MD2}$ of the second magnetic domain MD2. When the magnetic domain wall DW moves in the +X direction and an area of the first magnetic domain MD1 in a portion overlapping the first ferromagnetic layer 1 in a plan view in the Z direction increases, the resistance value of the magnetic domain wall movement element 103 decreases. On the contrary, when the magnetic domain wall DW moves in the −X direction and an area of the second magnetic domain MD2 in a portion overlapping the first ferromagnetic layer 1 in a plan view in the Z direction increases, the resistance value of the magnetic domain wall movement element 103 increases.

The magnetic domain wall DW moves by causing a write current to flow in the X direction of the second ferromagnetic layer 2 or by applying an external magnetic field. For example, when a write current (for example, a current pulse) is applied in the +X direction of the second ferromagnetic layer 2, electrons flow in the −X direction opposite to the current, and thus the magnetic domain wall DW moves in the −X direction. In a case in which a current flows from the first magnetic domain MD1 to the second magnetic domain MD2, the electrons spin-polarized in the second magnetic domain MD2 reverse the magnetization $M_{MD1}$ of the first magnetic domain MD1. By reversing the magnetization $M_{MD1}$ of the first magnetic domain MD1, the magnetic domain wall DW moves in the −X direction.

Since the magnetic domain wall movement element 103 shown in FIG. 8 includes the magnetoresistance effect element 10 containing a crystallized Heusler alloy and having a large MR ratio, the magnetic domain wall movement element 103 can accurately record data.

Figure 9:
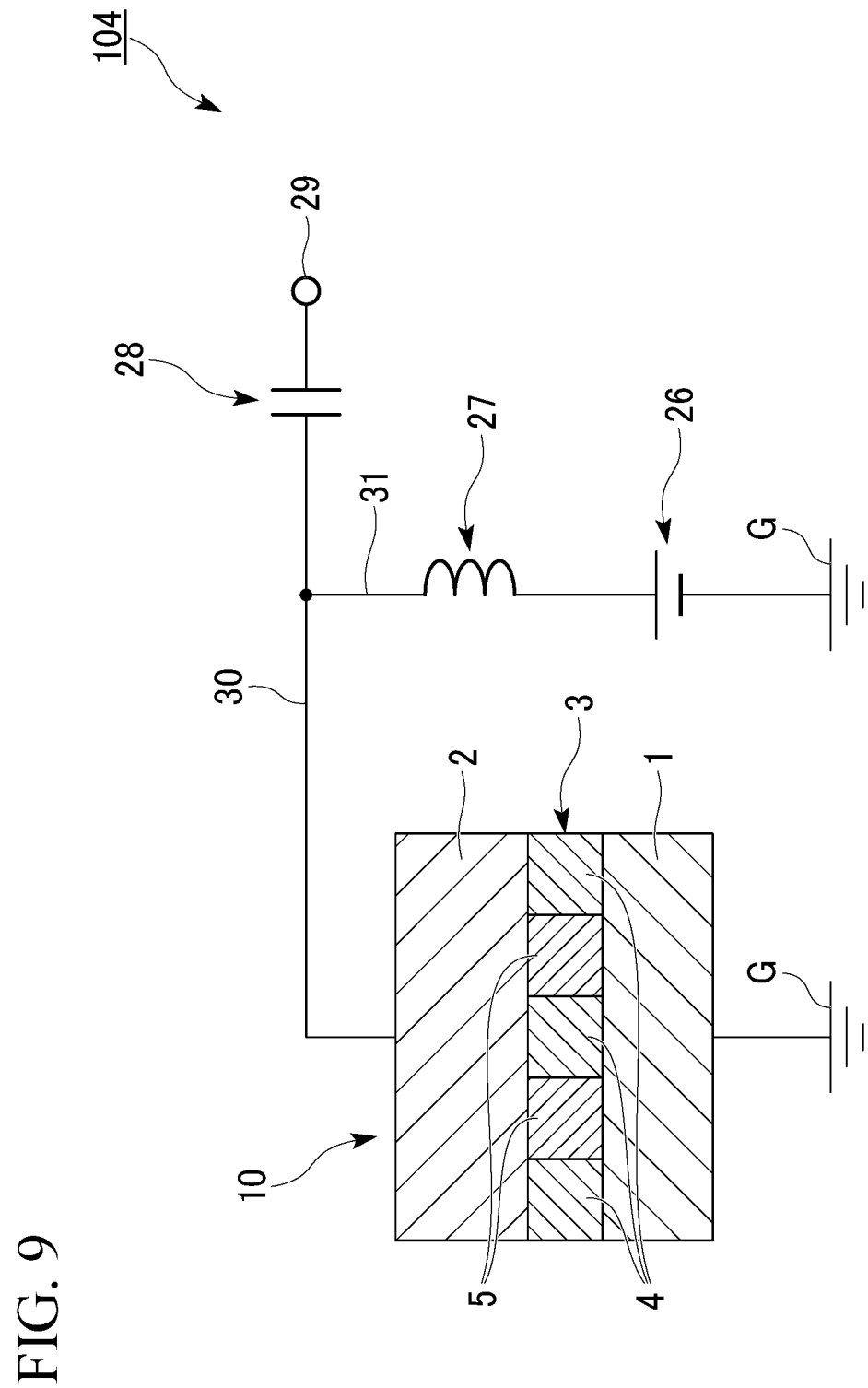
FIG. 9 is a cross-sectional view of a radio frequency device according to Application Example 5.

FIG. 9 is a schematic view of a radio frequency device 104 according to Application Example 5. As shown in FIG. 9, the radio frequency device 104 has the magnetoresistance effect element 10, a DC power supply 26, an inductor 27, a capacitor 28, an output port 29, and wirings 30 and 31.

The wiring 30 connects the magnetoresistance effect element 10 and the output port 29 to each other. The wiring 31 branches off from the wiring 30 and reaches a ground G via the inductor 27 and the DC power supply 26. As the DC power supply 26, the inductor 27, and the capacitor 28, known ones can be used. The inductor 27 cuts a radio frequency component of a current and passes an invariant component of the current. The capacitor 28 passes the radio high frequency component of the current and cuts the invariant component of the current. The inductor 27 is arranged in a portion where it is desired to curb the flow of a radio frequency current, and the capacitor 28 is arranged in a portion where it is desired to curb the flow of a direct current.

When an alternating current or alternating magnetic field is applied to the ferromagnetic layer included in the magnetoresistance effect element 10, the magnetization of the second ferromagnetic layer 2 precesses. The magnetization of the second ferromagnetic layer 2 strongly oscillates in a case when the frequency of the radio frequency current or radio frequency magnetic field applied to the second ferromagnetic layer 2 is in the vicinity of a ferromagnetic resonance frequency of the second ferromagnetic layer 2 and does not oscillate much at a frequency far from the ferromagnetic resonance frequency of the second ferromagnetic layer 2. This phenomenon is called a ferromagnetic resonance phenomenon.

The resistance value of the magnetoresistance effect element 10 changes according to the oscillation of the magnetization of the second ferromagnetic layer 2. The DC power supply 26 applies a DC current to the magnetoresistance effect element 10. The DC current flows in the stacking direction of the magnetoresistance effect element 10. The direct current flows to the ground G through the wirings 30 and 31 and the magnetoresistance effect element 10. The potential of the magnetoresistance effect element 10 changes according to Ohm's law. A radio frequency signal is output from the output port 29 according to the change in potential (a change in resistance value) of the magnetoresistance effect element 10.

Since the radio frequency device 104 shown in FIG. 9 includes the magnetoresistance effect element 10 containing a crystallized Heusler alloy and having a wide range of the change in resistance value, the radio frequency device 104 can transmit a high-output radio frequency signal.

EXAMPLES

Example 1

As Example 1, the magnetoresistance effect element 10 shown in FIG. 1 was manufactured. The base layer and the cap layer were made of Ru, and the first ferromagnetic layer 1 and the second ferromagnetic layer 2 were made of a Heusler alloy having a compositional proportion of $Co_2Fe_{0.9}Ga_{0.5}Ge_{0.9}$. The first region 4 of the nonmagnetic layer 3 was made of Ag, and the second region 5 of the nonmagnetic layer 3 was made of NiCr.

The magnetoresistance effect element 10 according to Example 1 was manufactured by the following procedure. First, the Ru base layer was formed on an amorphous substrate by sputtering. Next, the first ferromagnetic layer 1 having the above composition was formed. At that time point, the first ferromagnetic layer 1 was amorphous.

Next, the nonmagnetic layer 3 was manufactured on the first ferromagnetic layer by simultaneously sputtering using a NiCr alloy target and a Ag target. A thickness of the nonmagnetic layer 3 was set to 5 nm.

Next, the second ferromagnetic layer 2 was formed on the nonmagnetic layer 3. After that, the Ru cap layer was formed on the second ferromagnetic layer 2 and the stacked body was annealed. Annealing was performed at 270° C. for 5 hours. Due to the annealing, the first ferromagnetic layer 1 and the second ferromagnetic layer 2 were crystallized.

The MR ratio of the manufactured magnetoresistance effect element 10 was measured. As for the MR ratio, a change in resistance value of the magnetoresistance effect element 10 was measured by monitoring a voltage applied to the magnetoresistance effect element 10 with a voltmeter while sweeping a magnetic field from the outside to the magnetoresistance effect element 10 with a constant current flowing in the stacking direction of the magnetoresistance effect element. The resistance value in a case where the magnetization directions of the first ferromagnetic layer 1 and the second ferromagnetic layer 2 are in parallel and the resistance value in a case where the magnetization directions of the first ferromagnetic layer 1 and the second ferromagnetic layer 2 are in anti-parallel were measured, and the MR ratio was calculated from the obtained resistance values by the following formula. The measurement of the MR ratio was performed at 300K (a room temperature).

$$\text{MR ratio (\%)} = (R_{AP} - R_P)/R_P \times 100$$

$R_P$ is the resistance value in a case where the magnetization directions of the first ferromagnetic layer 1 and the second ferromagnetic layer 2 are in parallel, and $R_{AP}$ is the resistance value in a case where the magnetization directions of the first ferromagnetic layer 1 and the second ferromagnetic layer 2 are in anti-parallel.

The MR ratio of the magnetoresistance effect element 10 according to Example 1 was 12.6%.

Further, a cross section TEM of the magnetoresistance effect element 10 manufactured under the same conditions was measured. The crystal structures of both the first region 4 and the second region 5 were a bcc structure. Further, the proportion of the second region 5 in the nonmagnetic layer 3 was measured from the cross section TEM. The proportion of the second region 5 was 50%.

Examples 2 to 7

Examples 2 to 7 differ from Example 1 in that the proportion of the second region 5 in the nonmagnetic layer 3 was changed. This proportion was changed by adjusting the electric power applied to the Ag target and the electric power applied to the NiCr target such that Ag and NiCr after the film formation had a desired compositional proportion.

In Example 2, the proportion of the second region 5 in the nonmagnetic layer 3 was 10%.

In Example 3, the proportion of the second region 5 in the nonmagnetic layer 3 was 20%.

In Example 4, the proportion of the second region 5 in the nonmagnetic layer 3 was 30%.

In Example 5, the proportion of the second region 5 in the nonmagnetic layer 3 was 40%.

In Example 6, the proportion of the second region 5 in the nonmagnetic layer 3 was 60%.

In Example 7, the proportion of the second region 5 in the nonmagnetic layer 3 was 70%.

In Example 8, the proportion of the second region 5 in the nonmagnetic layer 3 was 80%.

In Example 9, the proportion of the second region 5 in the nonmagnetic layer 3 was 90%.

The MR ratio of the magnetoresistance effect element according to Example 2 was 12.1%. The MR ratio of the magnetoresistance effect element according to Example 3 was 14.3%. The MR ratio of the magnetoresistance effect element according to Example 4 was 14.8%. The MR ratio of the magnetoresistance effect element according to Example 5 was 13.2%. The MR ratio of the magnetoresistance effect element according to Example 6 was 10.7%. The MR ratio of the magnetoresistance effect element according to Example 7 was 10.2%. The MR ratio of the magnetoresistance effect element according to Example 8 was 7.9%. The MR ratio of the magnetoresistance effect element according to Example 9 was 7.3%.

Comparative Example 1

Comparative Example 1 differs from Example 1 in that the NiCr target is not used and the nonmagnetic layer 3 is constituted by only the first region 4. That is, in Comparative Example 1, the proportion of the second region 5 in the nonmagnetic layer 3 was 0%.

Comparative Example 2

Comparative Example 2 differs from Example 1 in that the Ag target is not used and the nonmagnetic layer 3 is constituted by only the second region 5. That is, in Comparative Example 2, the proportion of the second region 5 in the nonmagnetic layer 3 was 100%.

The MR ratio of the magnetoresistance effect element according to Comparative Example 1 was 6.2%. The MR ratio of the magnetoresistance effect element according to Comparative Example 2 was 3.2%.

Figure 10:
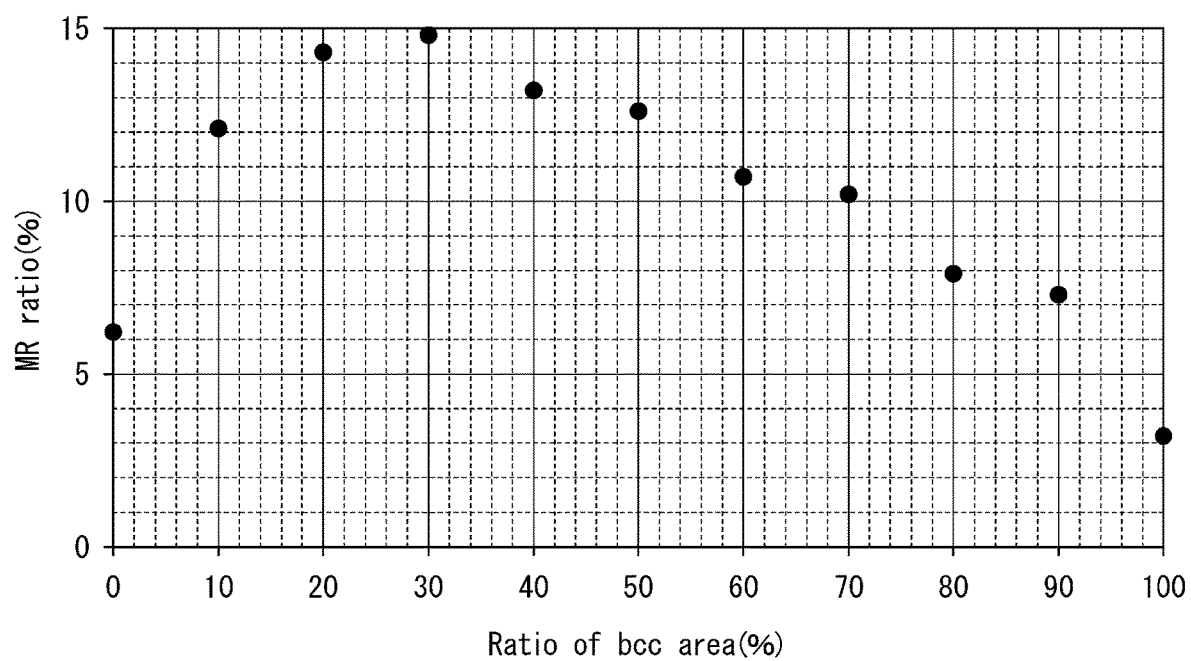
FIG. 10 shows measurement results of MR ratios of Examples and Comparative Examples.

The results of Examples 1 to 9 and Comparative Examples 1 and 2 are summarized in FIG. 10.

Comparative Example 3

Comparative Example 3 differs from Example 1 in that an alloy target of Mg and Ag was used as the target for forming the nonmagnetic layer 3. The compositional proportion of Mg and Ag in the alloy target of Mg and Ag was Mg:Ag=50:50 in terms of atomic percentage. Then, an alloy film manufactured in an oxygen atmosphere was oxidized. As a result of the oxidation, some of Mg became MgO. As a result, two regions were formed in the nonmagnetic layer. The first region was Ag, and the second region was MgO. The crystal structures of Ag and MgO were each a bcc structure. The proportion of the second region (MgO) in the nonmagnetic layer was 50%.

The MR ratio of Comparative Example 3 was 9.2%, which was lower than the MR ratio of Example 1. In Comparative Example 3, crystallization of the first ferromagnetic layer 1 and the second ferromagnetic layer 2 is promoted due to MgO having the bcc structure. On the other hand, in Comparative Example 3, it is considered that the MR ratio decreased by some of Ag being oxidized due to oxidation during the manufacturing of MgO.

EXPLANATION OF REFERENCES

1 First ferromagnetic layer
2 Second ferromagnetic layer
3 Nonmagnetic layer
4 First region
5 Second region
8 Spin-orbit torque wiring
10 Magnetoresistance effect element
21 Resistance measuring device
22 Power supply
23 Measuring part
24 First magnetization fixed layer
25 Second magnetization fixed layer
26 DC power supply
27 Inductor
28 Capacitor
29 Output port
30, 31 Wiring
100, 101, 102 Magnetic recording element
103 Magnetic domain wall movement element
104 Radio frequency device
DW Magnetic domain wall
MD1 First magnetic domain
MD2 Second magnetic domain

What is claimed is:

1. A magnetoresistance effect element comprising:
a first ferromagnetic layer, a second ferromagnetic layer, and a nonmagnetic layer,
wherein the nonmagnetic layer is between the first ferromagnetic layer and the second ferromagnetic layer,
wherein at least one of the first ferromagnetic layer and the second ferromagnetic layer is a Heusler alloy layer,
wherein the nonmagnetic layer includes a first region and a second region in a plane,
wherein both of the first region and the second region are formed of a metal,
wherein the second region is different in constituent material from the first region, and
wherein the second region has a crystal structure of a body-centered cubic lattice structure (bcc).

2. The magnetoresistance effect element according to claim 1, wherein at least a part of the second region penetrates the nonmagnetic layer in a stacking direction.

3. The magnetoresistance effect element according to claim 1, wherein the second region contains any element selected from the group consisting of Mg, V, Cr, Nb, Mo, Ta, and W.

4. The magnetoresistance effect element according to claim 3, wherein the second region is formed of an alloy containing V or Cr.

5. The magnetoresistance effect element according to claim 1, wherein a lattice matching degree between the Heusler alloy layer and the second region is within 4%.

6. The magnetoresistance effect element according to claim 1, wherein, in the Heusler alloy layer, crystals are mainly oriented in a (001) or (011) direction.

7. The magnetoresistance effect element according to claim 1, wherein the second region accounts for 10% or more and 70% or less of the nonmagnetic layer.

8. The magnetoresistance effect element according to claim 1, wherein the second region accounts for 10% or more and 50% or less of the nonmagnetic layer.

9. The magnetoresistance effect element according to claim 1,
wherein the Heusler alloy layer is represented by a composition formula $Co_2Y_\alpha Z_\beta$,
wherein the Y is one or more elements selected from the group consisting of Fe, Mn, and Cr,
wherein the Z is one or more elements selected from the group consisting of Si, Al, Ga, and Ge, and
wherein $\alpha+\beta>2$ is satisfied.

10. The magnetoresistance effect element according to claim 9, wherein the Y is Fe, and the Z is Ga and Ge.

11. The magnetoresistance effect element according to claim 1,
wherein the Heusler alloy layer is represented by a composition formula $Co_2Fe_\alpha Ga_{\beta 1} Ga_{\beta 2}$, and
wherein $\alpha+\beta 1+\beta 2>2.3$, $\alpha<\beta 1+\beta 2$, $0.5<\alpha<1.9$, $0.1\leq\beta 1$, and $0.1\leq\beta 2$ are satisfied.

12. The magnetoresistance effect element according to claim 1, wherein the first region has a crystal structure of a body-centered cubic lattice structure (bcc).

13. The magnetoresistance effect element according to claim 12, wherein a lattice matching degree between the Heusler alloy layer and the first region is within 4%.

* * * * *